(12) United States Patent
Cheng et al.

(10) Patent No.: US 9,966,502 B2
(45) Date of Patent: May 8, 2018

(54) LIGHT-EMITTING DEVICE

(71) Applicant: EPISTAR CORPORATION, Hsinchu (TW)

(72) Inventors: Ching-Tai Cheng, Hsinchu (TW); Yih-Hua Renn, Hsinchu (TW); Guan-Wu Chen, Hsinchu (TW); Chun-Hua Shih, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days. days.

(21) Appl. No.: 15/088,858

(22) Filed: Apr. 1, 2016

(65) Prior Publication Data

US 2017/0288095 A1    Oct. 5, 2017

(51) Int. Cl.
*H01L 33/46* (2010.01)
*H01L 33/50* (2010.01)

(52) U.S. Cl.
CPC ........... *H01L 33/46* (2013.01); *H01L 33/502* (2013.01)

(58) Field of Classification Search
CPC .................... H01L 33/46; H01L 33/502
See application file for complete search history.

(56) References Cited

U.S. PATENT DOCUMENTS

| | | | |
|---|---|---|---|
| 2006/0086943 A1* | 4/2006 | Wu | H01L 33/46 257/98 |
| 2009/0261366 A1 | 10/2009 | Eisert et al. | |
| 2011/0272727 A1 | 11/2011 | Su et al. | |
| 2014/0061704 A1* | 3/2014 | Yamada | H01L 33/62 257/98 |
| 2015/0155426 A1* | 6/2015 | Jeon | H01L 33/46 438/29 |

* cited by examiner

*Primary Examiner* — Matthew Reames
(74) *Attorney, Agent, or Firm* — Muncy, Geissler, Olds & Lowe, P.C.

(57) ABSTRACT

A light-emitting device includes a light-emitting element, and a covering layer. The light-emitting element includes a top surface, a bottom surface, a light-emitting stack between the top surface and the bottom surface, and an adhesion enhancing layer surrounding the light-emitting stack. The covering layer covers the light-emitting element and contacts the adhesion enhancing layer. Moreover, the adhesion enhancing layer includes an oxide and a thickness greater than 5 nm and less than 1000 nm.

18 Claims, 10 Drawing Sheets

US 9,966,502 B2

LIGHT-EMITTING DEVICE

BACKGROUND

Technical Field

The present disclosure relates to a light-emitting device including a light-emitting element and a covering layer disposed on the light-emitting element, and in particular to a light-emitting device with improved adhesion strength between the light-emitting element and the covering layer.

Description of the Related Art

The light-emitting diodes (LEDs) of the solid-state lighting elements have the characteristics of low power consumption, low heat generation, long operational life, shockproof, small volume, quick response. In general, the light-emitting device includes a light-emitting element and an encapsulant to seal the light-emitting element. An adhesion strength between the light-emitting element and the encapsulant can affect the reliability of the LEDs.

SUMMARY OF THE DISCLOSURE

A light-emitting device includes a light-emitting element, and a covering layer. The light-emitting element includes a first top surface, a bottom surface, a light-emitting stack between the first top surface and the bottom surface, and an adhesion enhancing layer surrounding the light-emitting stack. The covering layer covers the light-emitting element and contacts the adhesion enhancing layer. Moreover, the adhesion enhancing layer includes an oxide and a thickness greater than 5 nm and less than 1000 nm.

DETAILED DESCRIPTION OF THE EMBODIMENTS

Figure 1A:
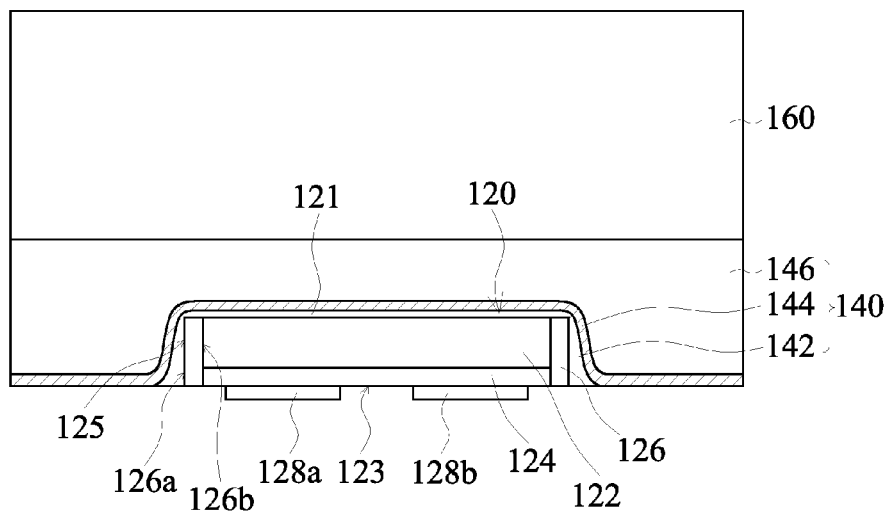
FIGS. 1A and 1B illustrate a light-emitting device in accordance with one embodiment of the present disclosure.

To better and concisely explain the disclosure, the same name or the same reference numeral given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accordance with the drawings.

Figure 1B:
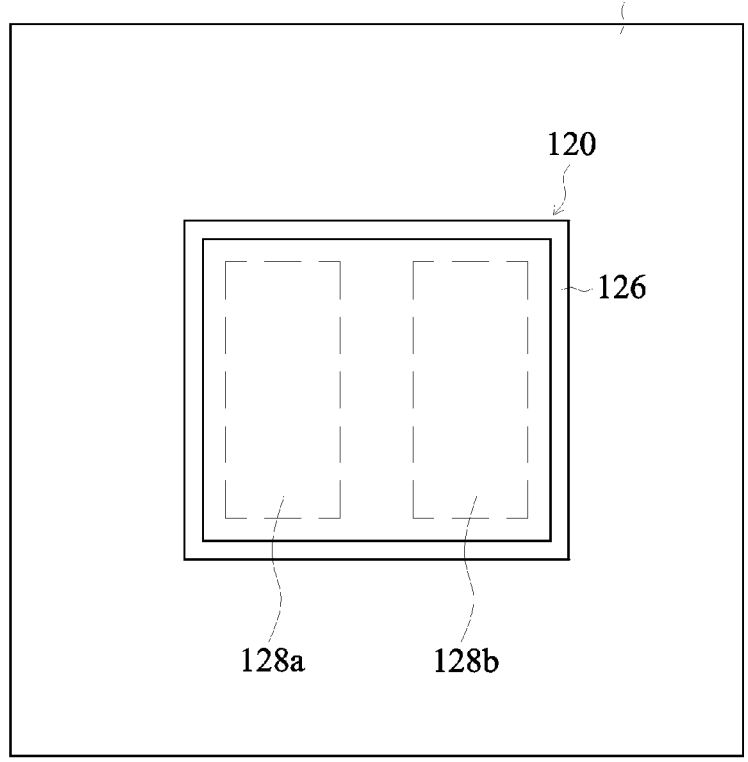

FIG. 1A is a cross sectional view of a light-emitting device 100 in accordance with one embodiment of the present disclosure. FIG. 1B shows a top view of the light-emitting device 100. Referring to FIG. 1A, the light-emitting device 100 includes a light-emitting element 120, a covering layer 140 covering the light-emitting element 120, and a transparent substrate 160 disposed on the covering layer 140.

The light-emitting element 120 can outwardly emit a first light mainly from the top surface 121. The light-emitting element 120 can be an LED die, for example, blue LED die or UV LED die. In one embodiment, the light-emitting element 120 is a blue LED die and can emit the first light having a dominant wavelength or a peak wavelength in the range of 430 nm and 490 nm. In other embodiment, the first light emitted from the light-emitting element 120 has a dominant wavelength or a peak wavelength in the range of 400 nm and 430 nm.

The light-emitting element 120 includes a top surface 121, a bottom surface 123 opposite to the top surface 121, and a plurality of side surfaces 125 connected to the top surface 121 and the bottom surface 123. The light-emitting element 120 includes a light-emitting stack having a first type semiconductor layer, a second type semiconductor layer, and a light-emitting layer between the first type semiconductor layer and the second type semiconductor layer, a positive electrical contact, and a negative electrical contact (not shown). The positive electrical contact and the negative electrical contact are used to electrically connect to submount, a circuit, or power source, and can be formed on the same side of the light-emitting layer (sometimes called "lateral LED"), or different sides of the light-emitting layer (sometimes called "vertical LED"). In one embodiment, the light-emitting element 120, which is a flip chip configuration, has a growth substrate 122, a light-emitting stack 124 disposed on the growth substrate 122, an adhesion enhancing layer 126 formed on sides of the growth substrate 122 and light-emitting stack 124, and electrical contacts 128a, 128b respectively disposed on a bottom surface of the light-emitting stack 124. The electrical contact 128a, electrical contact 128b, or both can be formed to be lower than a bottommost surface of the covering layer 140. Electrical contacts 128a, 128b can respectively be connected to an anode and a cathode of an external power source.

In one embodiment, the light-emitting stack 124 includes a first semiconductor layer, a light-emitting layer, and a second semiconductor layer (not shown) which are sequentially formed on the growth substrate 122. The growth substrate 122, for example, can be sapphire. The light-emitting stack 124 contains gallium nitride. The first semiconductor layer includes a n-type semiconductor material. The second semiconductor layer contains a p-type semiconductor material. Moreover, the electrical contacts 128a, 128b can be electrically connected to the first semiconductor layer and the second semiconductor layer, respectively.

In further embodiment, the adhesion enhancing layer 126 can increase an adhesion strength between the light-emitting element 120 and the covering layer 140 so as to reduce a peeling problem occurred between the light-emitting element 120 and covering layer 140. In one embodiment, the adhesion enhancing layer 126 has a transmittance to the first light greater than 50%. In other embodiments, the transmittance of the adhesion enhancing layer 126 to the first light is equal to or greater than 60%, 70% or 80%. The adhesion enhancing layer 126 covers all side surfaces of the growth substrate 122 and the light-emitting stack 124. The top surface 121 is exposed from the adhesion enhancing layer 126 so as the light-emitting element 120 and the covering layer 140 can be directly connected to each other, and the adhesion strength is therefore increased. In another embodiment, the adhesion enhancing layer 126 covers all side surfaces of the growth substrate 122 and the light-emitting stack 124, and also covers the top surface 121 so that the adhesion strength between the light-emitting element 120 and the covering layer 140 is increased. When the adhesion enhancing layer 126 has a refractive index greater than that of the growth substrate 122, the first light can be reflected at the interface between the adhesion enhancing layer 126 and the covering layer 140.

The adhesion enhancing layer 126 includes an outer surface 126a and an inner surface 126b opposite to the outer surface 126a. In one embodiment, the outer surface 126a is identical to the side surface 125 of the light-emitting element 120.

The adhesion enhancing layer 126 can be made of an inorganic material. In one embodiment, the adhesion enhancing 126 can be made of an oxide material. In one embodiment, the adhesion enhancing layer 126 includes $Nb_2O_5$ (refractive index is about 2.3). Moreover, the adhesion enhancing layer 126 has more defects on its surfaces than the growth substrate 122 so that the surfaces of the adhesion enhancing layer 126 has more dangling bonds which can increase the amount of hydroxyl (OH) group. The hydroxyl (OH) group can enhance adhesion strength with the covering layer 140. In one embodiment, the adhesion enhancing layer 126 covers the side surfaces of the growth substrate without covering its top surface so that the density of the hydroxyl (OH) group on the side surfaces 125 of the light-emitting element 120 is greater than the top surface 121 thereof. The method of analyzing the amount of hydroxyl (OH) group of surfaces of the light-emitting device 100 can use XPS (X-Ray Photoelectron Spectroscopy).

In one embodiment, the adhesion enhancing layer 126 has a thickness greater than 5 nm and less than 1000 nm. The thickness of the adhesion enhancing layer 126 is defined as a distance from the outer surface 126a to the inner surface 126b. In another embodiment, the thickness of the adhesion enhancing layer 126 is ranged between 10 nm and 200 nm. When the thickness of the adhesion enhancing layer 126 is less than 5 nm, the adhesion enhancing layer 126 can have some openings or pits which decrease the total area for connecting to the covering layer 140 and the bonding strength. Furthermore, the throughput of forming the adhesion enhancing layer 126 is decreased when the thickness of the adhesion enhancing layer 126 is greater than 1000 nm.

In one embodiment, the adhesion enhancing layer 126 has a refractive index greater than 1.90. The adhesion enhancing layer 126 is functioned as a side wall of the light-emitting element 120 and has the refractive index greater than that of the growth substrate 122. Therefore, a part of the first light from the light-emitting stack 124 can be reflected on the interface between the growth substrate 122 and the adhesion enhancing layer 126.

The covering layer 140 can protect the light-emitting element 120. In one embodiment, the covering layer 140 covers the top surface 121 of the light-emitting element 120 and side surfaces 125, and exposes the bottom surface 123. In another embodiment, the covering layer 140 directly contacts the adhesion enhancing layer 126. In one embodiment, the covering layer 140 is connected to the light-emitting element 120 and the transparent substrate 160. In one embodiment, the covering layer 140 is made of material(s) including a silicone resin. Moreover, to increase light extraction, the refractive index of the covering layer 140 is preferably greater than 1.50.

In further embodiment, the covering layer 140 includes an inner cover layer 142, a wavelength conversion layer 144, and an outer cover layer 146. Moreover, the wavelength conversion layer 144 is sandwiched between the inner cover layer 142 and outer cover layer 146. In one embodiment, the inner cover 142 is arranged to surround the top surface 121 and the side surfaces 125. Moreover, the inner cover 142 has a thickness increasing along a direction from the top surface 121 to the bottom surface 123, as shown in FIG. 1A. In one embodiment, the wavelength conversion layer 144 is directly formed on the inner cover layer 142. In another embodiment, the outer cover layer 146 has a side surface coplanar with a side surface of the transparent substrate 160. Moreover, an upper surface of the outer cover layer 146 directly contacts a bottom surface of the transparent substrate 160. In other embodiment, the inner cover layer 142 can be omitted so that the wavelength conversion layer 144 is directly contacted to the light-emitting element 120.

Furthermore, the wavelength conversion layer 144 includes a wavelength conversion material (not shown) and a transparent binder (not shown).

In one embodiment, the wavelength conversion material is formed to disperse a plurality of wavelength conversion particles within the transparent binder. The wavelength conversion particles can absorb the first light to emit a second light. The first light and the second light have different spectrums. For example, the wavelength conversion particles can emit a yellow light with a dominant wavelength or a peak wavelength in a range of 530 nm and 590 nm. For example, the wavelength conversion particles can emit a green-yellow light with a dominant wavelength or a peak wavelength in a range of 515 nm and 575 nm. For example, the wavelength conversion particles can emit a red light with a dominant wavelength or a peak wavelength in the range of 590 nm and 650 nm. In one embodiment, the first light and the second light can be mixed to emit a white light.

The wavelength conversion particles can be chosen from inorganic phosphor, organic fluorescent colorant, semiconductor material, or combinations thereof. The semiconductor material includes nanocrystal semiconductor material, such as quantum-dot luminescent material.

The transparent binder can be used to disperse the wavelength conversion particles within a space and fix related positions between the wavelength conversion particles. The transparent binder can have a higher transparency to the first light and the second light. The transparency rate is of 80%, 90%, 95% or 99%.

The materials of the transparent binder can be chosen from a thermosetting resin, for example, a silicone resin or an epoxy resin.

The inner cover layer 142 or the outer cover layer 146 can be made of material(s) identical to, similar to, or different from the transparent binder.

The transparent substrate 160 can provide a support to the light-emitting element 120 and the covering layer 140. Moreover, the transparent substrate 160 can be transparent to the first light and second light. The transparent substrate 160 can made of a glass, a transparent polymer, or a transparent ceramic. However, in other embodiment, the transparent substrate 160 can be replaced by an opaque substrate.

In one embodiment, when the light-emitting element 120 and the covering layer 140 have larger total contact area, the adhesion strength also increases. The total contact area is herein defined as a total area that the covering layer 140 possibly contacts the light-emitting element 120. For example, the top surfaces of the growth substrate 122 and the adhesion enhancing layer 126, and the outer side surfaces of the adhesion enhancing layer 126 are collectively the so-called total contact area. Moreover, an enhanced contact area is herein defined as a total area that the covering layer 140 possibly contacts the adhesion enhancing layer 126. For example, the top surfaces of the adhesion enhancing layer 126, and the outer side surfaces of the adhesion enhancing layer 126 are collectively the so-called enhanced contact area. When a ratio of the enhanced contact area to the total contact area increases, the adhesion strength also increases. However, if the refractive index of the adhesion enhancing layer 126 is greater than that of the growth substrate 122, the light extraction may be worsen by total internal reflection when the adhesion enhancing layer 126 covers all or portion of the top surface 121 of the light-emitting element 120 (the ratio of the enhanced contact area to the total contact area equals to 1, when the adhesion enhancing layer 126 completely covers the top surface 121). In one embodiment, the ratio of the enhanced contact area to the total contact area is in a range of 0.25 and 0.6.

In one embodiment, the total contact area is 0.0093 cm$^2$ and the ratio of the actual contact area to the total contact area is 0.45. The adhesion strength between the light-emitting element 120 and the covering layer 140 is greater than 900 g. Therefore, the adhesion strength is not less than 96774 g/cm$^2$.

The adhesion strength can be accessed by measuring the shear strength between the light-emitting element 120 and the covering layer 140. The measurement can be taken at position(s) between the top surface 121 of the light-emitting element 120 and a top surface of the covering layer 140. Moreover, the measuring instrument can use the bond tester provided by Sinvek Precision Co., Ltd, MFM series, for example.

Referring to FIG. 1B, a top view of the light-emitting device 100, the light-emitting element 120 has the adhesion enhancing layer 126 and electrical contacts 128a, 128b which is enclosed by the adhesion enhancing layer 126. Moreover, the covering layer 140 surrounds the light-emitting element 120 in the top view.

Figure 2:
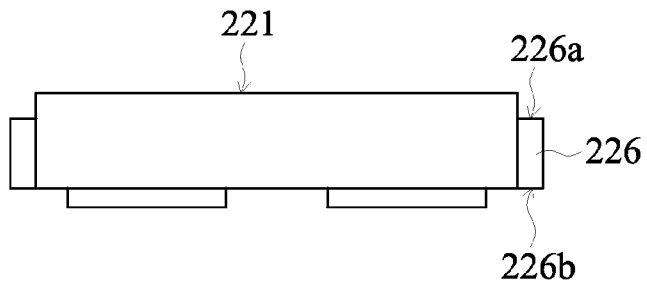
FIG. 2 illustrates a light-emitting element in accordance with another embodiment of the present disclosure.

FIG. 2 illustrates a plane view of a light-emitting element 220 in accordance with another embodiment of the present disclosure. The adhesion enhancing layer 226 has a top surface 226a and a bottom surface 226b. The top surface 226a is lower than a top surface 221 of the light-emitting element 220. The bottom surface 226b is substantially coplanar with a lower surface opposite the top surface 221.

Figure 3:
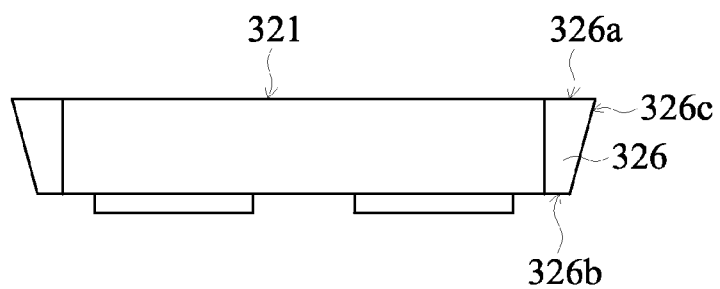
FIG. 3 illustrates a light-emitting element in accordance with further embodiment of the present disclosure.

FIG. 3 illustrates a plane view of a light-emitting element 320 in accordance with another embodiment of the present disclosure. The adhesion enhancing layer 326 has a top surface 326a, a bottom surface 326b, and a side surface 326c which is inclined against the top surface 326a and the bottom surface 326b by supplementary angles. If the angle between the top surface 326a and the side surface is less than one right angle, the top surface 326a is wider than the bottom surface 326b. On the contrary, if the angle between the top surface 326a and the side surface is greater than one right angle, the top surface 326a is narrower than the bottom surface 326b. In one embodiment, the top surface 326a of the adhesion enhancing layer 326 is substantially coplanar with the top surface 321 of the light-emitting element 320, and the bottom surface 326b is substantially coplanar with a bottom surface of the light-emitting element 320.

Figure 4:
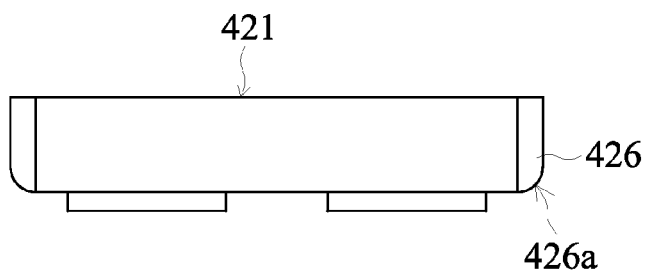
FIG. 4 illustrates a light-emitting element in accordance with another embodiment of the present disclosure.

FIG. 4 illustrates a plane view of a light-emitting element 420 in accordance with another embodiment of the present disclosure. The adhesion enhancing layer 426 has a round corner 426a or a chamfer (not shown) between two adjacent surfaces of the adhesion enhancing layer 426.

Figure 5A:
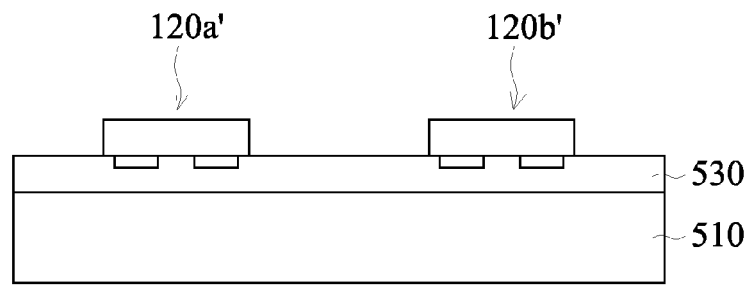
FIGS. 5A~5I illustrate a method of making the light-emitting device shown in FIG. 1A.

FIGS. 5A~5I illustrate a method of making the light-emitting device 100 shown in FIG. 1A. Referring to FIG. 5A, a carrier 510 is provided. Pre-treated light-emitting elements 120a' and 120b' are disposed on the carrier 510. The pre-treated light-emitting element is herein defined as a light-emitting element which is in a status before the adhesion enhancing layer is formed. Moreover, pre-treated light-emitting elements 120a' and 120b' are physically separated from each other by a distance. In one embodiment, the pre-treated light-emitting elements 120a' and 120b' and the carrier 510 are temporarily bonded to the carrier 510 by an adhesive 530. The carrier 510 can support the pre-treated light-emitting elements 120a' and 120b' in following one or more treatments or processes. In another embodiment, the pre-treated light-emitting elements 120a' and 120b' are temporarily bonded to the carrier 510 in a configuration that electrodes of the pre-treated light-emitting elements 120a' and 120b' are arranged to face to or fall into the adhesive 530.

Figure 5B:
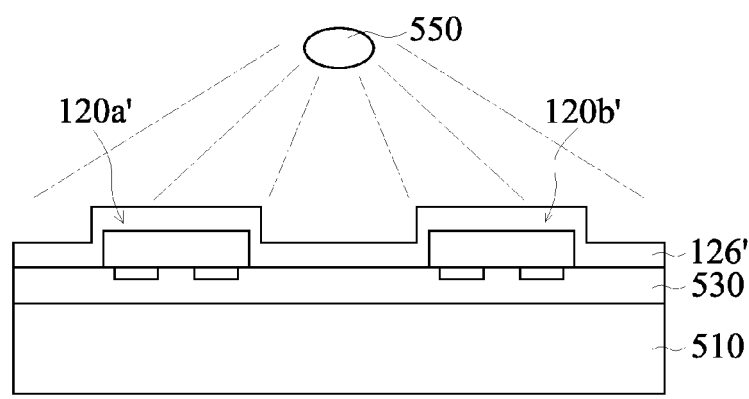

Referring to FIG. 5B, an adhesion enhancing layer 126' is applied to the pre-treated light-emitting elements 120a' and 120b' to cover top and side surfaces of the pre-treated light-emitting elements and some areas of the adhesive 530. The adhesion enhancing layer 126' is formed by sputtering. In one embodiment, a target 550 is used in a sputtering process for providing sputtering material. The adhesion enhancing layer 126' formed by sputtering has a better uniformity.

Figure 5C:
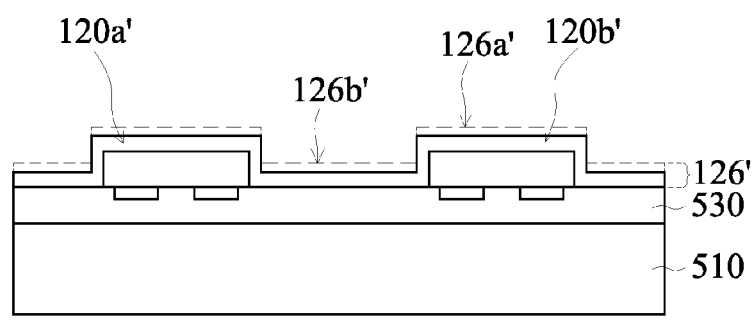

Referring to FIG. 5C, a portion of the adhesion enhancing layer 126' is removed by dry etching or wet etching. The removed portions of the adhesion enhancing layer 126' are drawn in dash lines. Specifically, the adhesion enhancing layer 126' is thinned down in areas 126a', 126b'. However, the thickness of the adhesion enhancing layer 126' is almost kept unchanged on side surfaces above the pre-treated light-emitting element 120a' and 120b'

Figure 5D:
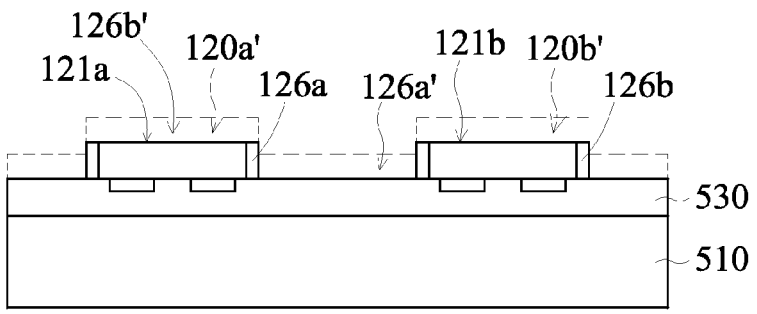

In one embodiment, referring to FIG. 5D, the areas 126a' and 126b' can be completely removed to expose top surfaces 121a and 121b and form separated adhesion enhancing layers 126a and 126b. In another embodiment, the adhesion enhancing layers 126a and 126b can be removed in a way as shown in FIG. 2. Specifically, the adhesion enhancing layers 126a or 126b has a topmost surface with an elevation lower than the top surfaces of the light-emitting element.

Figure 5E:
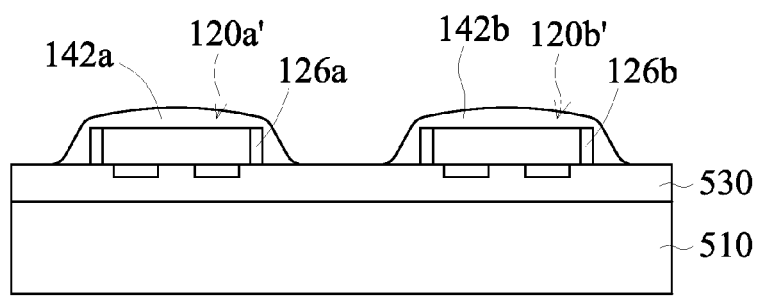

Referring to FIG. 5E, inner layers 142a and 142b are formed on the light-emitting elements 120a and 120b, respectively. In one embodiment, the inner layers 142a and 142b have curved profiles in a cross sectional view. In further embodiment, the inner layers 142a and 142b can be formed by coating, dispensing or molding.

Figure 5F:
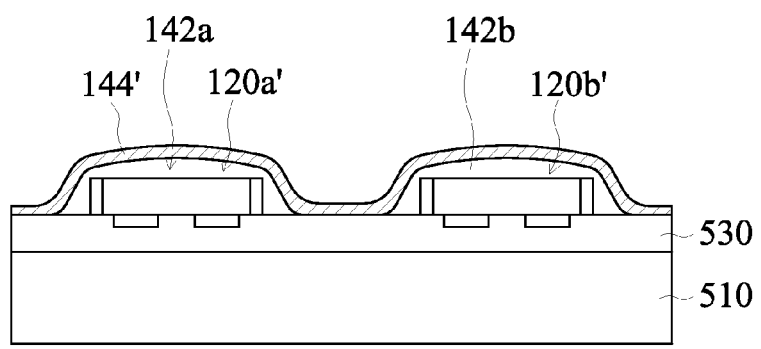

Referring to FIG. 5F, a wavelength conversion layer 144' is continuously formed on the inner layers 142a and 142b. In one embodiment, the wavelength conversion layer 144' is formed on the inner layers 142a and 142b and the adhesive 530 by spraying method. In other embodiment, the inner cover layers 142a and 142b can be formed by coating, dispensing, molding or laminating. In further embodiment, the wavelength conversion layer 144' is formed by using a wavelength conversion sheet which is pre-formed before applying to the light-emitting elements 120a and 120b.

Figure 5G:
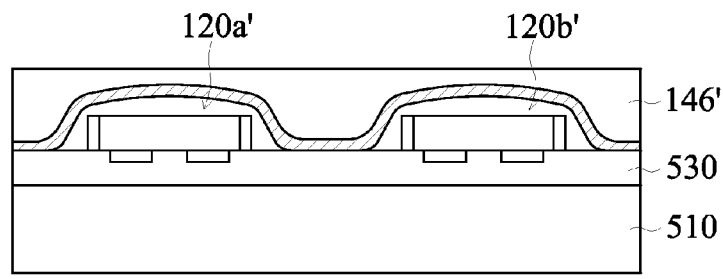

Referring to FIG. 5G, an outer layer 146' is formed on the wavelength conversion layer 144'. The outer layer 146' can be formed on the wavelength conversion layer 144' by a molding process, for example.

Figure 5H:
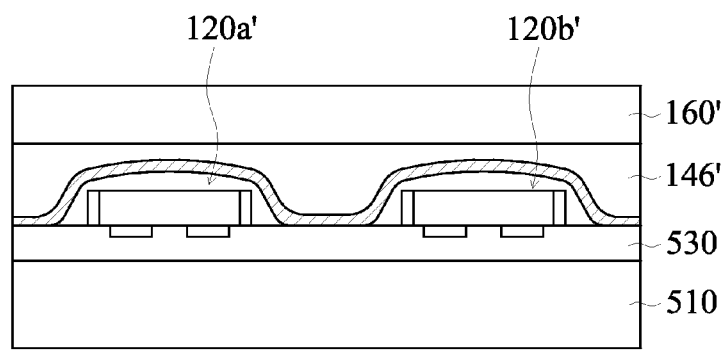

Referring to FIG. 5H, a transparent substrate 160' is bonded to the outer layer 146'. In one embodiment, the outer layer 146' is constructed by a thermosetting resin. The thermosetting resin can be cured by imposing pressure and increasing temperature. After the thermosetting is completely cured, the transparent substrate 160' can be secured to underlying structure.

Figure 5I:
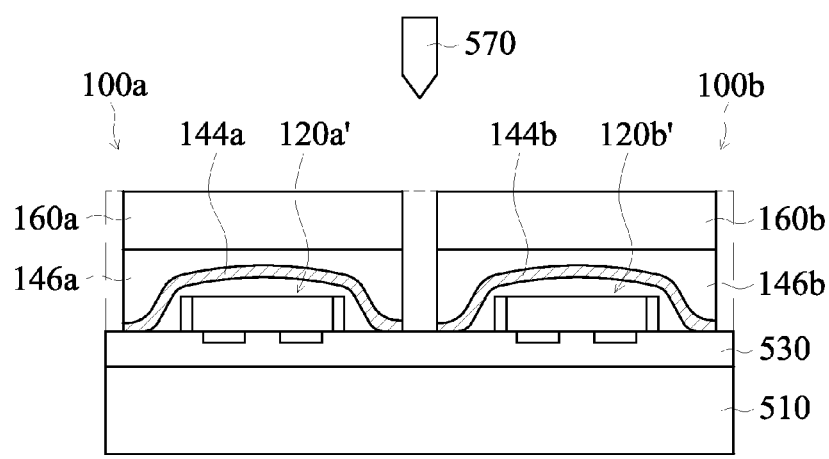

Referring to FIG. 5I, the wavelength conversion layer 144', the outer layer 146' and the transparent substrate 160' are divided into separated parts by removing materials between the light-emitting elements 120a and 120b. In one embodiment, side surfaces of the outer cover layers 146a and the transparent substrates 160a 146b is substantially coplanar with each other. Side surfaces of the outer cover layers 146a and the transparent substrates 160b are substantially coplanar with each other. In one embodiment, the dividing process is performed by using a blade 570.

Figure 6A:
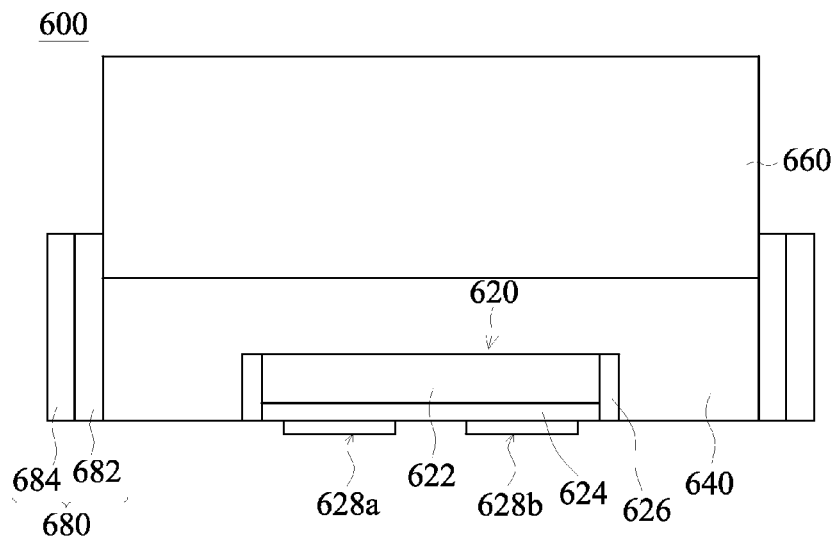
FIGS. 6A and 6B illustrate a light-emitting device in accordance with another embodiment of the present disclosure.

FIG. 6A is a cross sectional view of a light-emitting device 600 in accordance with an embodiment of the present disclosure. The light-emitting device 600 includes a light-emitting element 620, a covering layer 640 covering the light-emitting element 620, a transparent substrate 660 disposed on the covering layer 640, and a reflective layer 680 surrounding the covering layer 640.

In one embodiment, the light-emitting element 620 includes a growth substrate 622, a light-emitting stack 624 disposed on the growth substrate 622, and electrical contacts 628a and 628b. The light-emitting element 620 can further include an adhesion enhancing layer 626.

The reflective layer 680 can reflect light upward. The light-emitting angle of the light-emitting device 600 is therefore decreased. The light striking reflective layer 680 can come from light directly radiated by the light-emitting element 620 and/or light coming from the light conversion layer (not shown). In one embodiment, the reflective layer 680 is formed on side surfaces of the covering layer 640 and spaced apart from the light-emitting element 620. In another embodiment, the reflective layer 680 can directly contact side surfaces of the light-emitting elements 620. In other words, the covering layer 640 merely covers area right above the light-emitting element 620 without surrounding the side surfaces thereof. In further embodiment, the reflective layer 680 can cover all or only part of side surfaces of the transparent substrate 660. As shown in FIG. 6A, a lower portion of the side surfaces of the transparent substrate 660 are covered by the reflective layer 680.

In one embodiment, the reflective layer 680 is a kind of distributed Bragg reflector (DBR) which includes one or more pairs of a low refractive index layer and a high refractive index layer 682 and 684. The lower refractive index layer can be made of silicon oxide, and the high refractive index layer can be made of titanium oxide. In one embodiment, the low reflective index layer 682 is directly applied on side surfaces of the covering layer 640 and the transparent substrate 660, and the high refractive index layer 684 is stacked on the low reflective index layer 682.

Figure 6B:
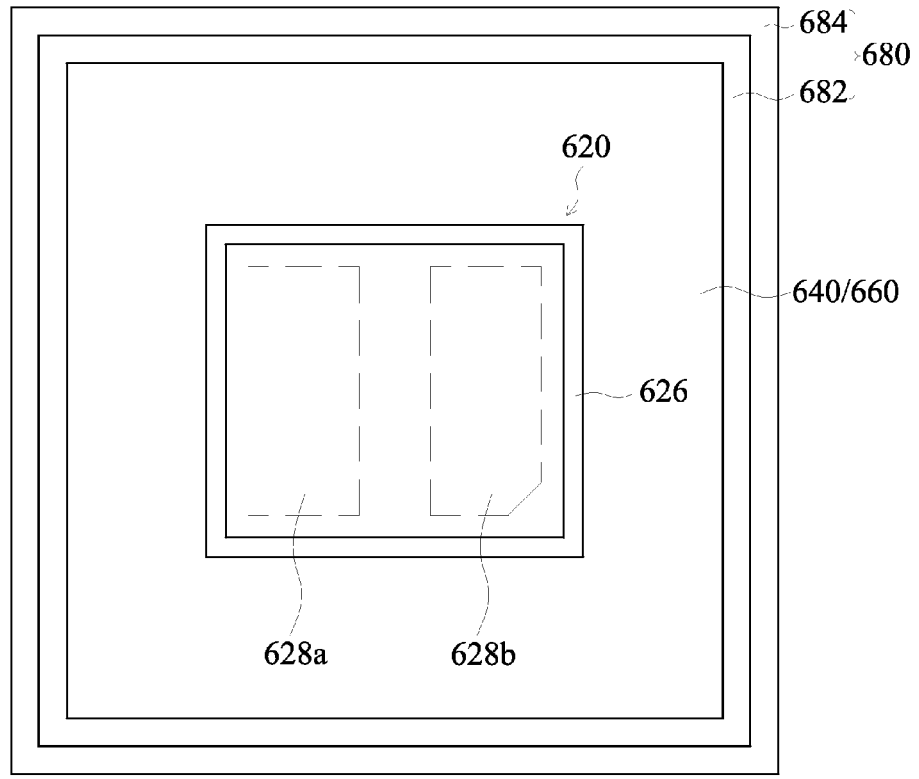

Referring to FIG. 6B, a top view of the light-emitting device 600 shown in FIG. 6A, the light-emitting element 620 is surrounded by the covering layer 640. Moreover, the reflective layer 680 surrounds the covering layer 140.

Figure 7A:
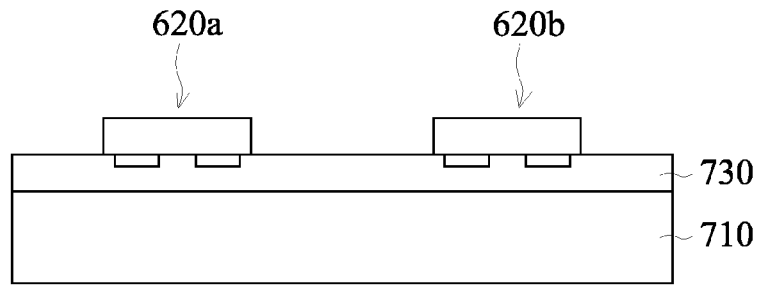
FIGS. 7A~7H illustrate a method of making the light-emitting device shown in FIG. 6A.

FIGS. 7A~7H illustrate a method of making the light-emitting device 600 shown in FIG. 6. Referring to FIG. 7A, a carrier 710 is provided. A plurality of light-emitting elements 620a and 620b is temporally bonded to the carrier 710 through an adhesive 730.

Figure 7B:
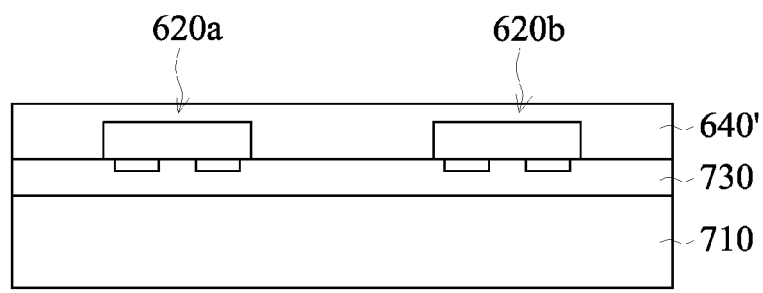

Referring to FIG. 7B, a covering layer 640' is applied to the light-emitting elements 620a and 620b. The covering layer 640' can cover top and side surfaces of the light-emitting elements 620a and 620b, and exposed areas of the adhesive 730. In one embodiment, the method of forming the covering layer 640' includes a molding process.

Figure 7C:
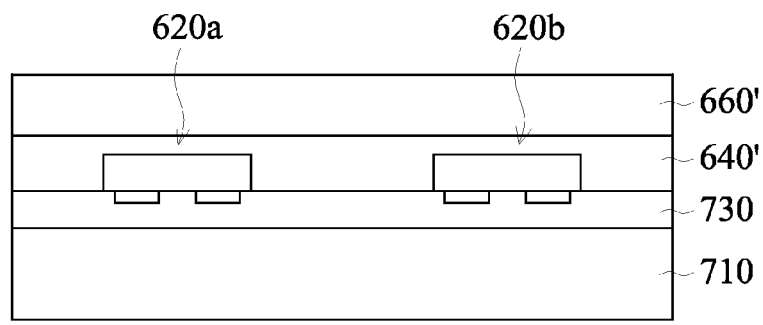

Referring to FIG. 7C, a transparent substrate 660' is bonded to the covering layer 640'.

Figure 7D:
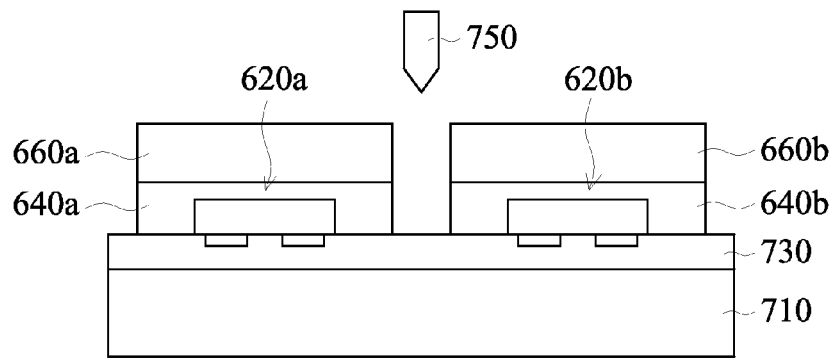

Referring to FIG. 7D, a cutting process is performed to divide the covering layer 640' and the transparent substrate 660' into covering layers 640a and 640b and transparent substrates 660a and 660b.

Figure 7E:
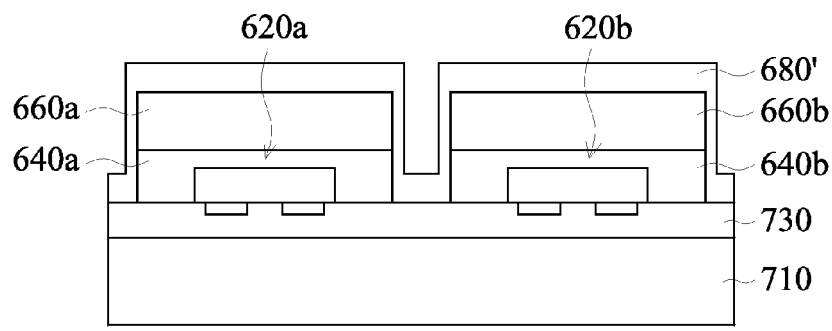

Referring to FIG. 7E, a reflective layer 680' is formed on top and side surfaces of the transparent substrates 660a and 660b, side surfaces of the covering layers 640a and 660b, and a portion of the adhesive 730. In one embodiment, the reflective layer 680' can be formed by sputtering method. In one embodiment, the reflective layer 680' includes several sub-layers with similar or different materials. For example, the sub-layers include alternately-stacked pairs. One alternately-stacked pair includes first sub-layer of silicon oxide and a second sub-layer of silicon nitride.

Figure 7F:
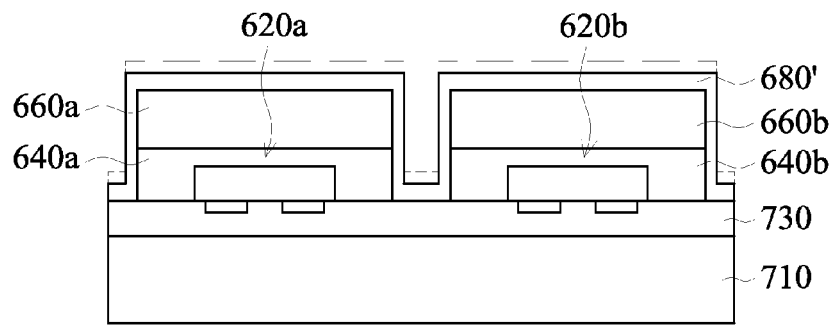

Referring to FIG. 7F, the reflective layer 680' is partially removed to decrease thicknesses of the portions facing to the same direction.

Figure 7G:
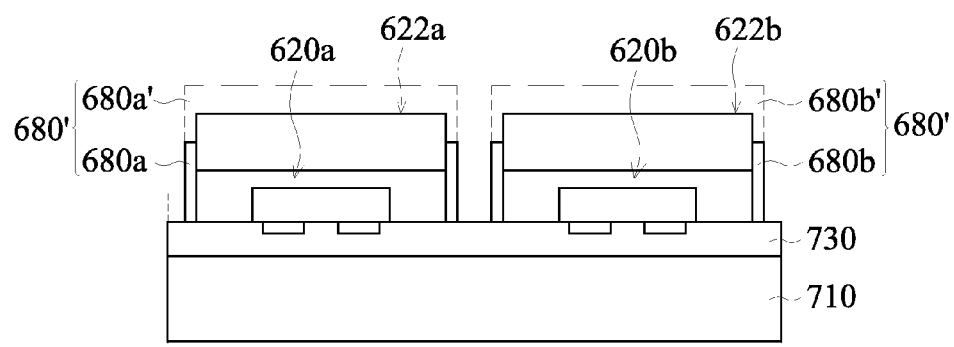

Referring to FIG. 7G, the reflective layer 680' can be further removed (the reflective layer 680a' and 680b') to expose top surfaces 662a and 662b of the transparent substrates 660a and 660b and form reflective layers 680a and 680b

Figure 7H:
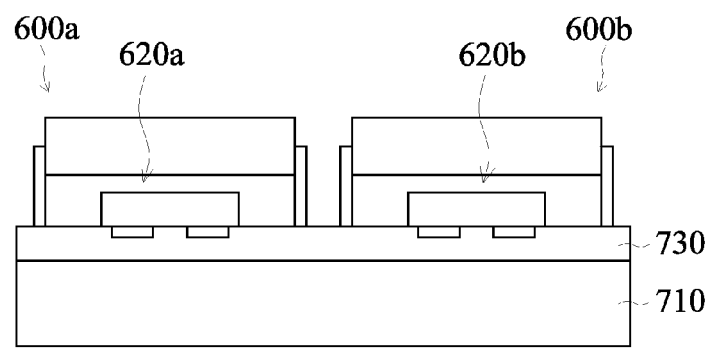

Referring to FIG. 7H, light-emitting device 600a and 600b can be singularized by detaching from the adhesive 730 and the carrier 710. In one embodiment, detaching process can be performed by heating the adhesive 730.

Figure 8:
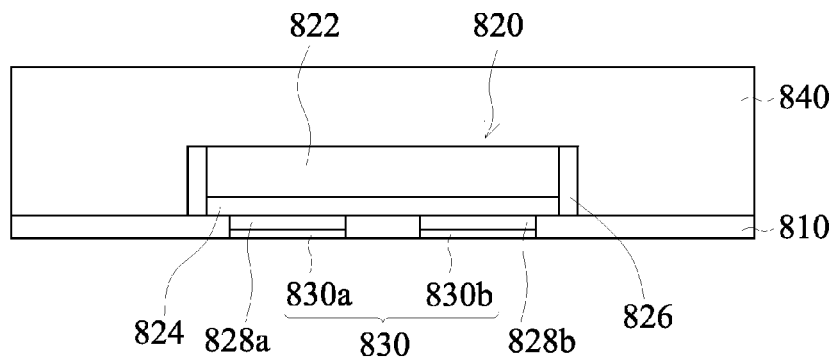
FIG. 8 illustrates a light-emitting device in accordance with another embodiment of the present disclosure.

FIG. 8 is a cross sectional view of a light-emitting device 800 in accordance with another embodiment of the present disclosure. The light-emitting device 800 includes a light-emitting element 820 and a covering layer 840 covering the light-emitting element 820. The light-emitting element 820 has a growth substrate 822, a light-emitting stack 824 formed on the growth substrate 822, an adhesion enhancing layer 826 surrounding the growth substrate 822 and the light-emitting stack 824, and electrical contacts 828a and 828b electrically connected to light-emitting stack 824.

Moreover, the light-emitting device 800 further includes a light reflection layer 810 formed on a bottom surface of the light-emitting element 820 and a bottom surface of the covering layer 840 and be surrounding the electrical contacts 828a and 828b. In one embodiment, the light reflection layer 810 includes a resin and light reflective material dispersed within the resin. The resin can selected from silicon resin or epoxy resin. The light reflective material can include white pigment, such as titanium oxide. The light reflective material can be formed by a screen printing method. Furthermore, bumps 830a and 830b are formed to cover the electrical contacts 828a, 828b, and contact side surfaces of the light reflection layer 810, respectively. The bumps 830a and 830b can be used as a physical and electrical connection to a circuit board or power source (not shown). The bumps 830a and 830b can be formed by plating or screen printing.

Figure 9:
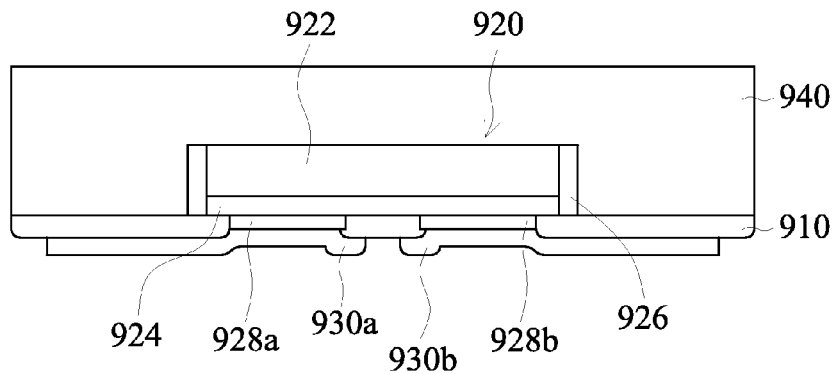
FIG. 9 illustrates a light-emitting device in accordance with another embodiment of the present disclosure.

FIG. 9 is a cross sectional view of a light-emitting device 900 in accordance with another embodiment of the present disclosure. The light-emitting device 900 includes a light-emitting element 920, a covering layer 940 covering the light-emitting element 920 and a light reflection layer 910 can be formed on a bottom surface of the light-emitting element 920 and a bottom surface of the covering layer 940. The light-emitting element 920 has a growth substrate 922, a light-emitting stack 924 formed on the growth substrate 922, an adhesion enhancing layer 926 surrounding the growth substrate 922 and the light-emitting stack 924, and electrical contacts 928a and 928b electrically connected to light-emitting stack 924.

Furthermore, extension electrodes 930a, 930b are formed to cover the electrical contacts 928a, 928b and contact surfaces of the light reflection layer 910, respectively. The extension electrode 930a or 930b can have a contour similar to surfaces of the electrical contacts 928a, 928b and the light reflection layer 910 on which the extension electrode 930a or 930b is formed. The extension electrodes 930a, 930b can be used as a physical and electrical connection to a circuit board or power source (not shown). The extension electrodes 930a, 930b can be formed by a plating process.

Figure 10:
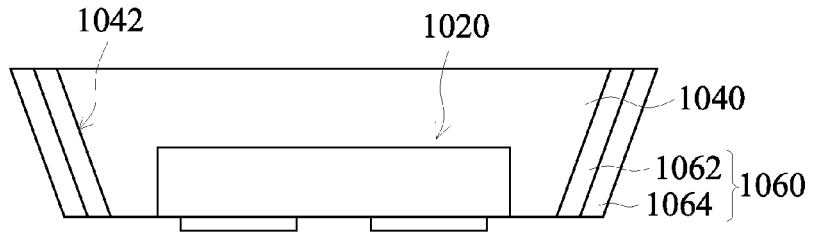
FIG. 10 illustrates a light-emitting device in accordance with another embodiment of the present disclosure.

FIG. 10 is a cross sectional view of a light-emitting device 1000 in accordance with another embodiment of the present disclosure. The light-emitting device 1000 includes a light-emitting element 1020, a covering layer 1040 covering the light-emitting element 1020, and a reflection layer 1060 surrounding a side surface 1042 of the covering layer 1040 without covering a top surface of the covering layer 1040. The reflection layer 1060 includes a low refractive index layer and a high refractive index layer 1062 and 1064. In one embodiment, the side surface 1042 is inclined against the top surface of the covering layer 1040 in a configuration that the light-emitting device 1000 has an inverted trapezoid shape. The inclined reflection layer 1060 can be beneficial to redirect the light from the light-emitting element 1020 to move in a way with smaller light angle.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a light-emitting element, having a topmost surface and a bottom surface, and comprising:
      a light-emitting stack comprising a plurality of outermost side surfaces;
      a first electrical contact and a second electrical contact, arranged under the light-emitting stack; and
      an adhesion enhancing layer surrounding the plurality of outermost side surfaces and comprising an oxide; and
   a covering layer, covering the light-emitting element and contacting the adhesion enhancing layer,
   wherein the adhesion enhancing layer has a thickness greater than 5 nm and less than 1000 nm, and
   wherein the adhesion enhancing layer does not cover the bottom surface directly between the first electrical contact and the second electrical contact.

2. The light-emitting device according to claim 1, wherein a total contact area is defined as a total area that the covering layer contacts the light-emitting element, an enhanced contact area is defined as a total area that the covering layer contacts the adhesion enhancing layer, a ratio of the enhanced contact area to the total contact area is in the range of 0.25 and 0.6.

3. The light-emitting device of claim 1, wherein the adhesion enhancing layer has a refractive index greater than 1.90 at a peak wavelength of about 400 nm to 490 nm.

4. The light-emitting device of claim 1, wherein the light-emitting device is connected to the covering layer by an adhesion strength not less than 96774 g/cm$^2$.

5. The light-emitting device of claim 1, wherein the light-emitting element further comprises a growth substrate which is epitaxially connected to the light-emitting stack, and has a material composition different from the light-emitting stack.

6. The light-emitting device of claim 5, wherein the adhesion enhancing layer directly contacts the growth substrate and exposes the topmost surface.

7. The light-emitting device of claim 5, wherein the adhesion enhancing layer comprises a sidewall which has a hydroxyl group density greater than the topmost surface.

8. The light-emitting device of claim 1, wherein the adhesion enhancing layer has an upper surface lower than the topmost surface.

9. The light-emitting device of claim 1, wherein the adhesion enhancing layer comprises an inclined plane.

10. The light-emitting device of claim 1, further comprising a transparent substrate formed on the covering layer.

11. The light-emitting device of claim 1, further comprising a reflective layer surrounding the covering layer.

12. The light-emitting device of claim 11, wherein the reflective layer comprises a distributed Bragg reflector.

13. The light-emitting device of claim 1, wherein the covering layer comprises a wavelength conversion layer.

14. The light-emitting device of claim 13, wherein the wavelength conversion layer comprises a wavelength conversion material and a transparent binder.

15. The light-emitting device of claim 1, wherein the covering layer has an inclined plane.

16. The light-emitting device of claim 5, wherein the adhesion enhancing layer has a refractive index greater than that of the growth substrate.

17. The light-emitting device of claim 5, wherein the adhesion enhancing layer comprises an inner surface directly contacting the growth substrate.

18. The light-emitting device of claim 1, wherein the adhesion enhancing layer is formed in a single material layer configuration.

\* \* \* \* \*